United States Patent [19]

Chang

[11] Patent Number: 4,973,858
[45] Date of Patent: Nov. 27, 1990

[54] RESONANT TUNNELING SEMICONDUCTOR DEVICES

[75] Inventor: Li-Gong Chang, Goldens Bridge, N.Y.

[73] Assignee: IBM Corporation, Armonk, N.Y.

[21] Appl. No.: 325,620

[22] Filed: Mar. 20, 1989

Related U.S. Application Data

[63] Continuation-in-part of Ser. No. 888,181, Jul. 18, 1986, abandoned.

[51] Int. Cl.$^5$ .............................................. H01L 29/72
[52] U.S. Cl. ....................................... 307/311; 357/4; 357/12; 357/16; 357/30
[58] Field of Search ....................... 357/12, 16, 34, 30; 307/311

[56] References Cited

U.S. PATENT DOCUMENTS 4,833,517  5/1989  Heiblumethal ....................... 357/12
4,849,799  7/1989  Capasso et al. ....................... 357/16

FOREIGN PATENT DOCUMENTS 159273  10/1985  European Pat. Off. ............. 357/12
253174   1/1988  European Pat. Off. .

OTHER PUBLICATIONS

Ricco et al., IBM Technical Disclosure Bulletin, vol. 27, No. 5, Oct. 1984, pp. 3053-3056.

Primary Examiner—William D. Larkins
Attorney, Agent, or Firm—Scully, Scott, Murphy & Presser

[57] ABSTRACT

Resonant tunneling semiconductor devices are disclosed useful for transport functions such as switching or amplification, and also for electro-optical conversions. In the structure of these devices, a central potential well is formed of an opposite conductivity type of semiconductor material to two semiconductor layers outside resonant tunneling barriers on each side of the central potential well, such that electrons in the well can tunnel to and from the outside semiconductor layers. The central potential well serves as the base of a three terminal device in transport applications, and as the light responsive portion for electro-optical applications. In one disclosed embodiment, the device is constructed in five layers of the most commonly used gallium-aliminum-arsenide compounds, an n GaAlAs, undoped GaAlAs, p GaAlAs, undoped GaAlAs, and n GaAlAs.

13 Claims, 2 Drawing Sheets

RESONANT TUNNELING SEMICONDUCTOR DEVICES

This patent application is a continuation-in-part application of parent application Ser. No. 888,181, filed July 18, 1986, now abandoned.

DESCRIPTION

1. Technical Field

The present invention relates generally to resonant tunneling semiconductor devices which are useful in transport applications such as in switching and amplification, and are also useful in electro-optical applications such as in laser generation and photodetection.

More particularly, the subject invention pertains to resonant tunneling semiconductor devices in which a central potential well is formed of an opposite conductivity semiconductor type to the layers outside the resonant tunneling barriers. The central potential well serves as the base of a three terminal device in transport applications, and as the radiation responsive or radiation generating portion of an electro-optical device in electro-optical applications.

2. Background Art

Three terminal semiconductor devices have been conceptualized since the observation of resonant tunneling through a quantum well between two barriers. However, conventional thinking, dealing only with electrons, encounters difficulties both conceptually in devising useful structures and technically in contacting the central, thin quantum well.

The principle of resonant tunneling through barriers has been described in Applied Phys. Lett., Vol. 24, No. 12, June 15, 1974. Briefly, this publication describes the observation of resonant tunneling of electrons in double-barrier structures having a thin GaAs layer sandwiched between two GaAlAs barriers. The resonance manifests itself as peaks in the tunneling current at voltages near the quasistationary states of the potential well. The structures are fabricated by molecular beam epitaxy which produces extremely smooth films and interfaces.

IBM TECHNICAL DISCLOSURE BULLETIN, Vol. 27, No. 5, October, 1984, Ricco, et al., discloses a tunable resonant tunneling semiconductor structure similar in some respects to the structure of the present invention. However, several significant distinctions exist with respect to the Ricco, et al., resonant tunneling semiconductor structure, all of which relate to difficulties or deficiencies in operation of the Ricco, et al., structure. A first distinction exists in that the end layers in Ricco, et al. are n+ (n+ means heavily doped n type semiconductor), while they are simply n in the present invention.

An accepted working definition of n+ doping is that the Fermi level (illustrated by a conventional dashed line in FIG. 3 of Ricco, et al., and also by a dashed/dotted line in FIG. 1 of the present patent application) is above the conduction band edge, whereas in n doping the Fermi level is below the conduction band edge—see FIG. 1 of the present application. The opposite is true of p+ doping in that the Fermi level is below the valance band edge, whereas in p doping the Fermi level is above the valance band edge—see FIG. 3 of Ricco, et al., and FIG. 1 of the present application.

The n+ doping in Ricco, et al., is given as $4 \times 10^{18}$ cm$^{-3}$, whereas the n doping in the present invention is defined as being between $10^{16}$ and $10^{17}$ cm$^{-3}$. The $4 \times 10^{18}$ cm$^{-3}$ doping of Ricco, et al., is at the maximum number of donors, and so is doped very heavily, see SEMICONDUCTING III-IV COMPOUNDS, by Hilsum and Rose-Innes, Pergamon Press, 1961.

Moreover, the fact that the end layers are n rather than n+ is very important. In the present invention an alloy-through p contact to the base layer from the top penetrates through the top n layer of $Ga_{1-x}Al_xAs$ (say emitter). A blocking p+-n junction is formed to impede current between the contact and the emitter, as required. Otherwise, as in Ricco, et al. the junction is a p+-n+ tunnel diode which is highly conductive, causing a large lateral current to flow between the base and emitter contacts through the body of the n+ layer. This is particularly true in view of the diffusion contact to the base disclosed by Ricco, et al. wherein the upper layer of the diffusion contact will be more conductive than lower layers because of the greater impurity or acceptor concentration as a result of the diffusion process. The base electrode will then become somewhat ineffective in control and cause the device to have operational problems or be unfunctional.

A second significant difference relative to Ricco, et al. (FIG. 4) is that the contact to the central quantum well is formed by p+- diffusion. In the present invention, the reach-through electrical contact to the quantum well is formed by alloying with the same type semiconductor material as the quantum well, which solves a real and significant problem in this art. The use of an alloyed contact to penetrate through two other layers to reach the thin central well region is a significant advance in resonant tunneling structures, as the art has struggled to find a solution to this difficult problem. An alloying contact is different from a diffused contact, as in Ricco, et al. Diffusion has to be done at high temperatures, such as 800°-1000° C., for a substantial time period, which is alright for thick devices, but will completely destroy the interface abruptness in a thin resonant tunneling structure as taught by the present invention.

A third significant difference is the p+ doping of the middle base layer, stated on page 3056 to be $10^{20}$ cm$^{-3}$, which is a maximum doping level. The p+ maximum doping introduces a dense layer of impurities in the middle base layer which will result in much scattering of the electrons traveling therethrough, which will result in a noncoherent electron wave function being transmitted thereby. Whereas, in contrast thereto, in the present invention the p doping of the middle base layer, at a doping level of $10^{16}$–$10^{17}$ cm$^{-3}$, does not introduce such a dense layer of impurities, which results in much less scattering of electrons and the transmission therethrough of a substantially coherent electron wave function.

Copeland, III et al U.S. Pat. No. 4,438,447 is somewhat pertinent to the present invention only to the extent that it discloses a vertical multilayer electro-optical structure. In greater detail, this patent discloses an electro-optic integrated circuit wherein the long electrical connections normally present on a large scale integrated circuit are replaced by an optical waveguide layer. A plurality of epitaxial layers are grown on a single substrate, and at least three of the plurality of epitaxial layers are grown with bandgaps that are suitable for optical sources, detectors and waveguides. These primary layers are separated from each other by a barrier layer having a bandgap greater than either of the adjacent primary layers. Two of the layers adjacent to the substrate are grown to accommodate electrical devices that can be used to couple electrical signals to the optical source layers, and to amplify electrical signals provided by the optical detection layer.

However, the prior art described hereinabove does not disclose or teach electron transport perpendicular to the layers, in particular resonant tunneling semiconductor structures of the present invention.

SUMMARY OF THE INVENTION

Accordingly, it is a primary object of the present invention to provide semiconductor devices operating on the principle of resonant tunneling which utilize a central potential well with opposite conductivity type to that of the two external layers outside the barriers.

A further object of the subject invention is the provision of three terminal resonant tunneling semiconductor devices useful for transport applications and also for electro-optical conversion applications.

In accordance with the teachings herein, the present invention provides resonant tunneling semiconductor devices constructed with first and second layers of like conductivity semiconductor crystal separated by first and second barriers of semiconductor crystal having therebetween a quantum well of opposite conductivity semiconductor crystal, such that conduction occurs by tunneling serially through the first and second barriers.

One problem associated with structures of this nature is the provision of an electrical contact extending to the quantum well, and the present invention provides a novel solution for this problem by forming the contact of the same type of conductivity semiconductor material as the central potential well. The contact is therefore of an opposite type of semiconductor material to the layers of semiconductor crystal outside the first and second barriers, such that electrical conductivity therebetween is prevented. This approach thereby allows the contact to physically contact either one or both of the layers of semiconductor material without establishing an electrical current path thereto.

The first and second layers of like conductivity semiconductor crystal can be either n or p type semiconductor crystal, as long as the quantum well is the opposite p or n type of semiconductor crystal.

In one disclosed embodiment with the most commonly used gallium-aluminum-arsenide compounds, the first and second layers are $Ga_{1-x2}Al_{x2}As$ semiconductor crystal, the first and second barriers are n $Ga_{1-x3}Al_{x3}As$ semiconductor crystal, and the quantum well is a p $Ga_{1-x1}Al_{x1}As$ semiconductor crystal.

The resonant tunneling device can be used for transport switching functions, wherein the first and second layers of like conductivity semiconductor crystal form the collector and emitter, and the quantum well forms the base, such that when a voltage applied to the base equals a threshold voltage, the device becomes conductive to provide for electrical conduction between the emitter and the collector. The resonant tunneling device can also be used for transport amplification functions wherein the voltage applied to the base determines the amplification function between the emitter and the collector.

The resonant tunneling device can also be used for electro-optical detection functions wherein the amount of radiation incident on the quantum well determines the current flow between the first and second layers of like conductivity semiconductor crystal, or for electro-optical lasing functions wherein the amount of radiation emitted by the quantum well is determined by the relative voltages of the first and second layers of like conductivity semiconductor crystal.

BRIEF DESCRIPTION OF THE DRAWINGS

The foregoing objects and advantages of the present invention for resonant tunneling semiconductor devices may be more readily understood by one skilled in the art with reference being had to the following detailed description of several preferred embodiments thereof, taken in conjunction with the accompanying drawings wherein like elements are designated by identical reference numerals throughout the several views, and in which.

DESCRIPTION OF THE PREFERRED EMBODIMENTS

The present invention concerns semiconductor devices which are generally three terminal devices based on the phenomenon of resonant tunneling. These devices are constructed from epitaxial layers of proper materials with suitable thickness and doping, such that the structures can be utilized to perform a variety of functions for transport and optoelectronics under different operational conditions. Applications for high speed switching or amplification and for efficient light emission and detection are particularly of interest.

Figure 1:
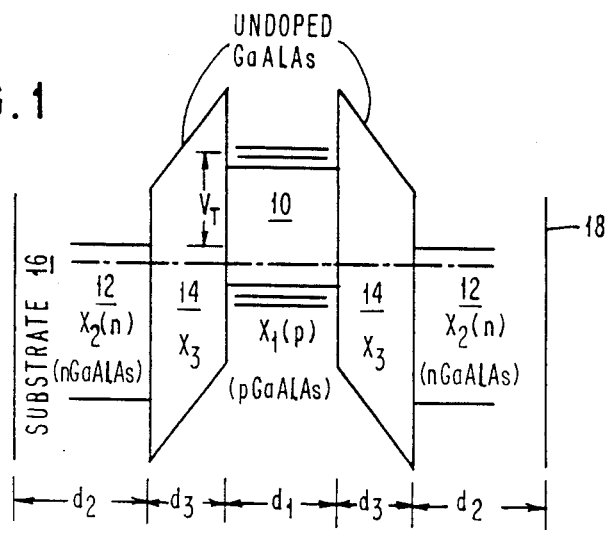
FIG. 1 illustrates an exemplary embodiment of a resonant tunneling semiconductor device constructed pursuant to the teachings of the present invention and illustrates the different crystal structures and associated energy levels therein.

Referring to an exemplary embodiment in FIG. 1, a central region 10 in which a semiconductor potential well is located is formed of an opposite conductivity type to the semiconductor layers 12 located outside of two resonant tunneling barriers 14, such that electrons can tunnel through the barriers 14. In transport applications, the central potential well serves as the base of a three terminal device, and in electro-optical applications the central potential well serves as the light responsive or light lasing portion. In the embodiment illustrated in FIG. 1, the device is constructed in five layers, n $Ga_{1-x2}Al_{x2}As$, undoped $Ga_{1-x3}Al_{x3}As$, p $Ga_{1-x1}Al_{x1}As$, undoped $Ga_{1-x3}Al_{x3}As$, n $Ga_{1-x2}Al_{x2}As$, between a buffer substrate 16 and a surface layer 18, with a reachthrough contact being provided to the p base.

In the structure of FIG. 1, the well is p-type with composition x1 (x refers the alloy composition of Al in GaAlAs) and width d1, the outside layers are n-type with composition x2 and width d2, and the barriers are undoped with composition x3 and width d3. The requirements are x1 x2 < x3, and d1 and d3 be of the order of 50A. The widths d2 are not critical. The n-contacts can be made in a conventional way to the x2 layer on the surface and from the n-substrate 16 on which the entire structure is grown, for example by molecular beam epitaxy. The p-layer 10 can be contacted by selective etching based on the type of conductivity, but is preferably constructed by alloying through the surface to form a contact of the same type semiconductor material as the quantum well, as explained in greater detail hereinbelow with reference to FIG. 6.

The use of $x_2$ for material 12 and $x_1$ for material 10 with $x_2 > x_1$ is a necessary condition. For transport devices, the ohmic p-contact from the surface to the central $Ga_{1-x1}Al_{x1}As$ layer will make contacts to both the outside n-layer ($Ga_{1-x2}Al_{x2}As$) and the barrier intrinsic layer ($Ga_{1-x3}Al_{x3}As$)(See FIG. 6). The intrinsic layer poses no problems because it is not conductive. However the contact to the n-layer will give rise to undesirable leakage current even for a p-n blocking contact. This problem can be alleviated by the use of a wider gap material such as $Ga_{1-x2}Al_{x2}As$ with $x_2 > x_1$. For optoelectronic devices, the requirement, $x_2 > x_1$, is essential for the light to penetrate to reach layer 10 without absorption or reabsorption in layer 12.

The use of an alloyed contact to penetrate through two other layers to reach the thin central well region must be looked upon in its entirety in resonant tunneling structures, as the art has struggled to find a solution to this problem. An etch-and-stop technique is tedious and difficult to say the least, in particular in view of the very thin central layer. It also destroys the planarity of the structure, which is important in particular for device arrays. Moreover, an alloying contact is different from a diffused contact, and diffusion has to be conducted at high temperatures, which is alright for thick devices, but will completely destroy the interface abruptness in a thin resonant tunneling structure as in the present invention.

The essence of resonant tunneling lies in the formation of quasi-stationary quantum states in the well at specific energies, depending on the details of the configuration (x, d, etc.). Typically, the lowest energy state is 10–100 meV with similar spacings between the states since more than one such state can generally be formed. This is shown in FIG. 1 by horizontal lines for both electron and hole states, only the former, however, are of interest here. The quantum states provide an effective channel of electron tunneling between the barriers. At these energies, an intensive electron wave is built inside the well so that a small leakage outside will result in nearly perfect transmission. On the other hand, at other energies (even with a single barrier), there is virtually no transmission.

Figure 2:
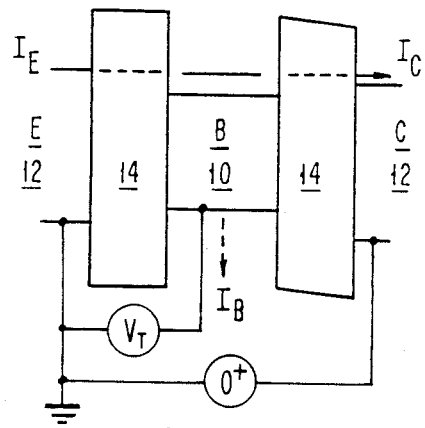
FIG. 2 illustrates a resonant tunneling semiconductor device functioning in a transport switching circuit.

Referring to FIG. 2, the electrodes are designated as the emitter E, the collector C, and the base B. In operation of the circuit of FIG. 2, when a voltage applied to the base equals a threshold voltage VT, the device becomes conductive to provide for electrical conduction between the emitter and the collector. For switching operations, we note that no appreciable current flows initially until VB=VT, the threshold voltage, when the device is sharply turned on. (FIG. 2). For this purpose, VE=0 and VC is slightly positive (0+) to provide states for tunneling. Since the tunneling time is much shorter than the recombination time, IC≃IE for nearly unit gain, and the base draws little current but operates as an effective gate.

Figure 3:
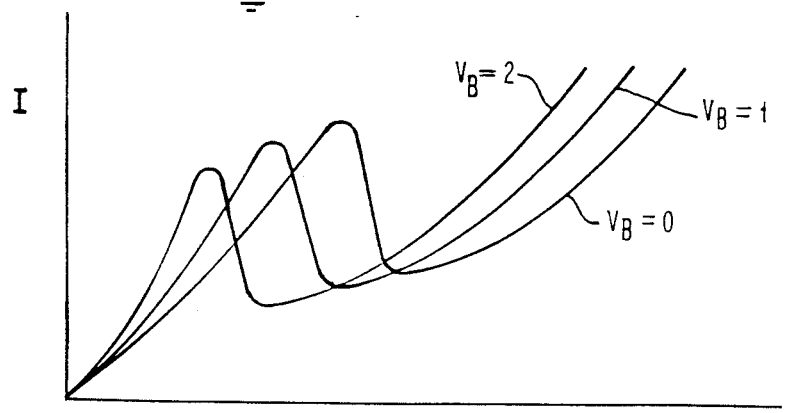
FIG. 3 illustrates a family of curves for a resonant tunneling semiconductor device of the same type as illustrated in FIGS. 1 and 2, which enable it to function in a transport amplification application with different base voltage levels.

FIG. 3 illustrates a family of curves for a resonant tunneling semiconductor device of the same type as illustrated in FIGS. 1 and 2. Here the resonant condition is reached by applying a voltage Vc. The current-voltage characteristic is governed by different base voltage levels (designated 0, 1, 2). The highly nonlinear current-voltage behavior, including a negative resistance, makes these structures capable of functioning not only as a flexible switching device but also as an amplifier or an oscillator.

Figure 4:
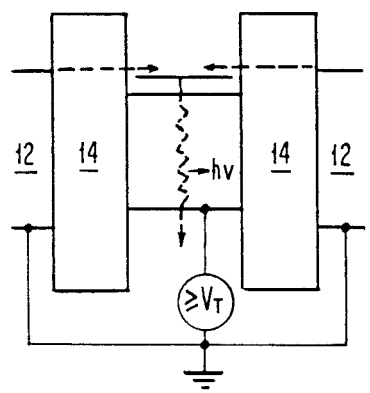
FIG. 4 is a schematic illustration of a resonant tunneling semiconductor device functioning in an electro-optical lasing circuit.
Figure 5:
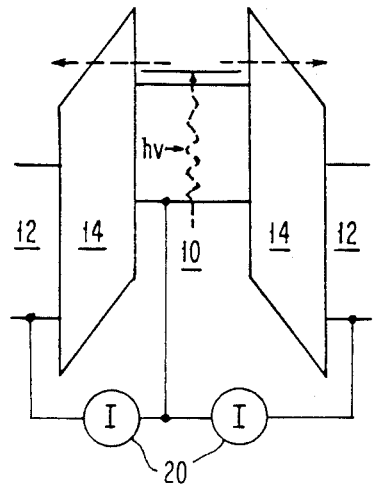
FIG. 5 is a schematic illustration of a resonant tunneling semiconductor device functioning in an electro-optical detection circuit.

For optoelectronic applications, the emitter and collector are biased at the same value, say VE=VC=0=-ground, and VB≧VT. FIG. 4 is a schematic illustration of a resonant tunneling semiconductor device functioning in an electro-optical emission circuit. As shown in FIG. 4, electrons flow into the well where they are trapped, and an intense wave is built up. Strong radiative recombination with holes occurs, leading to light emitting and lasing actions. The reverse of this situation makes the device an effective detector (FIG. 5). Electrons generated in the well tunnel rapidly to the outside electrodes, where external circuitry in the form of current meters 20 are used for sensitive detection. The application of a bias voltage is optional in this case.

For operation of these devices, the penetration (or traversal) time is estimated to be very short, $tt = (m/2E)^{\frac{1}{2}} \cdot d3$ where m is the electron mass and E is the electron energy. This is calculated to be smaller than $10^{-14}$ sec, which poses no serious limit for continuous operation. The limiting time for switching is expectedly the storage time or the time for the electron wave to build up or decay. It is given by $\tau_o/T$ where $\tau_o$ is the frequency the electron wave striking the barrier and T is the transmission at resonance. Typically, it is about $10^{-12}$ sec. The delay (or charging) time is not significant in comparison. An estimate from $gm^{-1}C$ gives $10^{-13}$ sec, where C is the capacitance and $g_m = \Delta J/\Delta v$ where $\Delta J$ is the current change at resonance and $\Delta v$ is the width in resonant energy ($hT/\tau_o$, h being Planck's constant). The various characteristic times are much shorter than the recombination time, which is usually in the nanosecond to sub-nanosecond range.

More than one quantum level is usually present. The operations can be tuned to each level if required. In other cases, a flat response at V > VT may be desirable. This can be achieved by designing the structure with close level spacings and asymmetrical barriers.

Complementary structures with n-well and p-outside layers are equally operable, as well as the use of multiple wells and superlattices instead of the single well. Also, different semiconductors can be used rather than alloys with different compositions. Indeed, combinations such as InAs and GaSb are ideal in that their band schemes closely resemble those shown in FIG. 1 without considering the space-charge effect which has been neglected. A general requirement is that the barrier material has the larger energy gap through which the carriers tunnel, and the well material has the smallest gap to facilitate contact formation and, light absorption.

Figure 6:
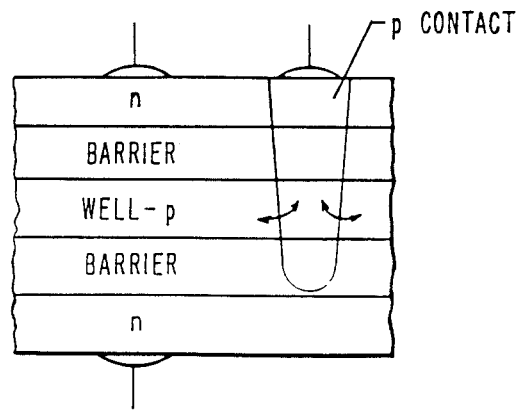
FIG. 6 illustrates a preferred embodiment of a contact extending to the quantum potential well of a resonant tunneling semiconductor device constructed pursuant to the teachings of the subject invention.

FIG. 6 illustrates a preferred embodiment of a contact extending to the quantum potential well of a resonant tunneling semiconductor device pursuant to the subject invention. One problem associated with structures of this nature is the provision of an electrical contact extending to the quantum well, and the present invention provides a novel solution for this problem by forming the contact of the same type of conductivity semiconductor material as the central potential well. The contact is therefore of an opposite type of semiconductor material to the layers of semiconductor crystal outside the first and second barriers, such that electrical conductivity therebetween is prevented. The contact is formed by an alloy contact which is melted to form a consistent contact throughout, as opposed to a diffusion contact which would cause different doping levels throughout because of the nature of the diffusion process. Accordingly, this approach allows the contact to physically contact either one or both of the layers of opposite semiconductor material without establishing an electrical current path thereto.

While several embodiments and variations of the present invention for resonant tunneling semiconductor devices are described in detail herein, it should be apparent that the disclosure and teachings of the present invention will suggest many alternative designs to those skilled in the art.

I claim:

1. A resonant tunneling semiconductor device, comprising first and second layers of n type semiconductor crystal, each having an n doping level between $10^{16}$ and $10^{17}$ cm$^{-3}$, separated by first and second barriers of semiconductor crystal having therebetween a quantum well of p type semiconductor crystal, having a p doping level between $10^{16}$ and $10^{17}$ cm$^{-3}$, such that conduction occurs by tunneling serially through the first and second barriers, wherein said first and second layers of n type semiconductor crystal have a composition of substitute alloy element $x_2$, said quantum well of p type semiconductor material has a composition of substitute alloy element $x_1$, and the first and second barriers of semiconductor crystal having a composition of substitute alloy element $x_3$, wherein $x_1 < x_2 < x_3$, and wherein said quantum well of p type semiconductor crystal defines a first energy gap, said first and second layers of n type semiconductor crystal define a second energy gap, and said first and second barriers of semiconductor crystal define a third energy gap, and said first energy gap is less than said second energy gap, and said second energy gap is less than said third energy gap, and further wherein an electrical contact extends to the quantum well, and is formed by a p type semiconductor material.

2. A resonant tunneling semiconductor device as claimed in claim 1, wherein the first and second layers of n type semiconductor crystal are n $Ga_{1-x_2}Al_{x_2}As$, the first and second barriers of semiconductor crystal are undoped $Ga_{1-x_3}Al_{x_3}As$, and the quantum well is a p $Ga_{1-x_1}Al_{x_1}As$ semiconductor crystal.

3. A resonant tunneling semiconductor device as claimed in claim 1, wherein said resonant tunneling semiconductor device includes an alloyed reach-through contact of p type semiconductor material extending through a layer of n type semiconductor material and a barrier of semiconductor material to the quantum well of p type material, said reach-through contact having a p doping level between $10^{16}$ and $10^{17}$ cm$^{-3}$.

4. A resonant tunneling semiconductor device as claimed in claim 1, wherein the resonant tunneling device is an electronic switch in a switching circuit, wherein the first and second layers of n type semiconductor crystal are the collector and emitter, and the quantum well is the base, wherein a ground voltage is defined by the emitter, a slightly positive voltage is applied to the collector, and when a voltage applied to the base equals a threshold voltage, the device becomes conductive to provide for electrical conduction between the emitter and the collector.

5. A resonant tunneling semiconductor device as claimed in claim 1, wherein the resonant tunneling device is an electronic amplifier in an amplifier circuit, wherein the first and second layers of n type semiconductor crystal are the collector and emitter, and the quantum well is the base, wherein a resonant condition is established by applying a positive voltage to the collector relative to a ground voltage applied to the emitter, and a voltage applied to the base determines the amplification function between the emitter and the collector.

6. A resonant tunneling semiconductor device as claimed in claim 1, wherein the resonant tunneling device is an optical emitter in an optical emitter circuit wherein the emitter and the collector are coupled together, and the voltage applied to the base relative to ground is equal to or greater than a threshold voltage, wherein the amount of radiation emitted by the quantum well is determined by the voltages of the first and second layers of n type semiconductor crystal relative to said quantum well.

7. A resonant tunneling semiconductor device as claimed in claim 1, wherein the resonant tunneling device is an optical detector in an optical detector circuit wherein the emitter and the collector are coupled together, and means for directing light onto the quantum well, and means for measuring the current flow from the base to the emitter and the collector, and wherein the amount of radiation incident on the quantum well determines the current flow between the quantum well and the first and second layers of n type semiconductor crystal.

8. A resonant tunneling semiconductor device comprising first and second layers of p type semiconductor crystal, each having a p doping level between $10^{16}$ and $10^{17}$ cm$^{-3}$, separated by first and second barriers of semiconductor crystal having therebetween a quantum well of n type semiconductor crystal, having an n doping level between $10^{16}$ and $10^{17}$ cm$^{-3}$, such that conduction occurs by tunneling serially through the first and second barriers, wherein said first and second layers of p type semiconductor crystal have a composition of substitute alloy element $x_2$, said quantum well of n type semiconductor material has a composition of substitute alloy element $x_1$, and the first and second barriers of semiconductor crystal have a composition of substitute alloy element $x_3$, wherein $x_1 < x_2 < x_3$, and wherein said quantum well of n type semiconductor crystal defines a first energy gap, said first and second layers of p type semiconductor crystal define a second energy gap, and said first and second barriers of semiconductor crystal define a third energy gap, and said first energy gap is less than said second energy gap, and said second energy gap is less than said third energy gap, and further wherein an electrical contact extends to the quantum well, and is formed by an n type semiconductor material.

9. A resonant tunneling semiconductor device as claimed in claim 8, wherein the resonant tunneling semiconductor device includes an alloyed reach-through contact of n type semiconductor material extending through a layer of p type semiconductor material and a barrier of semiconductor material to the quantum well of n type material, said reach-through contact having an n doping level between $10^{16}$ and $10^{17}$ cm$^{-3}$.

10. A resonant tunneling semiconductor device as claimed in claim 8, wherein the resonant tunneling device is an electronic switch in a switching circuit, wherein the first and second layers of p type semiconductor crystal are the collector and emitter, and the quantum well is the base, wherein a ground voltage is defined by the emitter, a slightly negative voltage is applied to the collector, and when a voltage applied to the base equals a threshold voltage, the device becomes conductive to provide for electrical conduction between the emitter and the collector.

11. A resonant tunneling semiconductor device as claimed in claim 8, wherein the resonant tunneling device is an amplifier in an amplifier circuit, wherein the first and second layers of p type semiconductor crystal are the collector and emitter, and the quantum well is the base, wherein a resonant condition is established by applying a negative voltage to the collector relative to a ground voltage applied to the emitter, and a voltage applied to the base determines the amplification function between the emitter and the collector.

12. A resonant tunneling semiconductor device as claimed in claim 8, wherein the resonant tunneling device is an optical emitter in an optical emitter circuit wherein the emitter and the collector are coupled together, and the voltage applied to the base relative to ground is equal to or greater than a threshold voltage, wherein the amount of radiation emitted by the quantum well is determined by the voltages of the first and second layers of p type semiconductor crystal relative to said quantum well.

13. A resonant tunneling semiconductor device as claimed in claim 8, wherein the resonant tunneling device is an optical detector in an optical detector circuit wherein the emitter and the collector are coupled together, and includes means for directing light onto the quantum well, and means for measuring the current flow from the base to the emitter and the collector, and wherein the amount of radiation incident on the quantum well determines the current flow between the quantum well and the first and second layers of p type semiconductor crystal.

* * * * *